(12) United States Patent
Miyanoiri et al.

(10) Patent No.: US 8,450,994 B2
(45) Date of Patent: May 28, 2013

(54) VOLTAGE APPLICATION TIME PERIOD MEASURING CIRCUIT AND POWER SUPPLY APPARATUS INCLUDING THE SAME

(75) Inventors: Jun Miyanoiri, Chiba (JP); Shinichi Idomukai, Chiba (JP); Tomoyuki Nakaue, Chiba (JP); Teruyuki Iwashima, Chiba (JP); Takashi Kohata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 403 days.

(21) Appl. No.: 12/950,758

(22) Filed: Nov. 19, 2010

(65) Prior Publication Data

US 2011/0122665 A1    May 26, 2011

(30) Foreign Application Priority Data

Nov. 26, 2009    (JP) .................................. 2009-269247

(51) Int. Cl.
*G01R 19/00* (2006.01)
(52) U.S. Cl.
USPC ........................................ 324/76.11; 324/119

(58) Field of Classification Search
USPC ............................ 324/76.16, 76.47, 607, 120
See application file for complete search history.

(56) References Cited

U.S. PATENT DOCUMENTS

| 7,434,077 | B2 * | 10/2008 | Saito et al. ..................... 713/340 |
| 7,688,073 | B2 * | 3/2010 | Shimazaki et al. ............ 324/382 |
| 7,723,964 | B2 * | 5/2010 | Taguchi .......................... 323/222 |
| 8,270,187 | B2 * | 9/2012 | Nakamoto et al. .............. 363/44 |

FOREIGN PATENT DOCUMENTS

JP    09-037461 A    2/1997

* cited by examiner

*Primary Examiner* — Melissa Koval
*Assistant Examiner* — Feba Pothen
(74) *Attorney, Agent, or Firm* — Brinks Hofer Gilson & Lione

(57) ABSTRACT

Provided are a voltage application time period measuring circuit which does not require a battery, and a power supply apparatus including the voltage application time period measuring circuit. Each of a voltage application time period memory (32) and a set time period memory (33) is a nonvolatile memory, and hence it is unnecessary to provide a battery for holding information stored in each of the memories in the outside of the voltage application time period measuring circuit (30) and a power supply apparatus cost is reduced correspondingly.

8 Claims, 17 Drawing Sheets

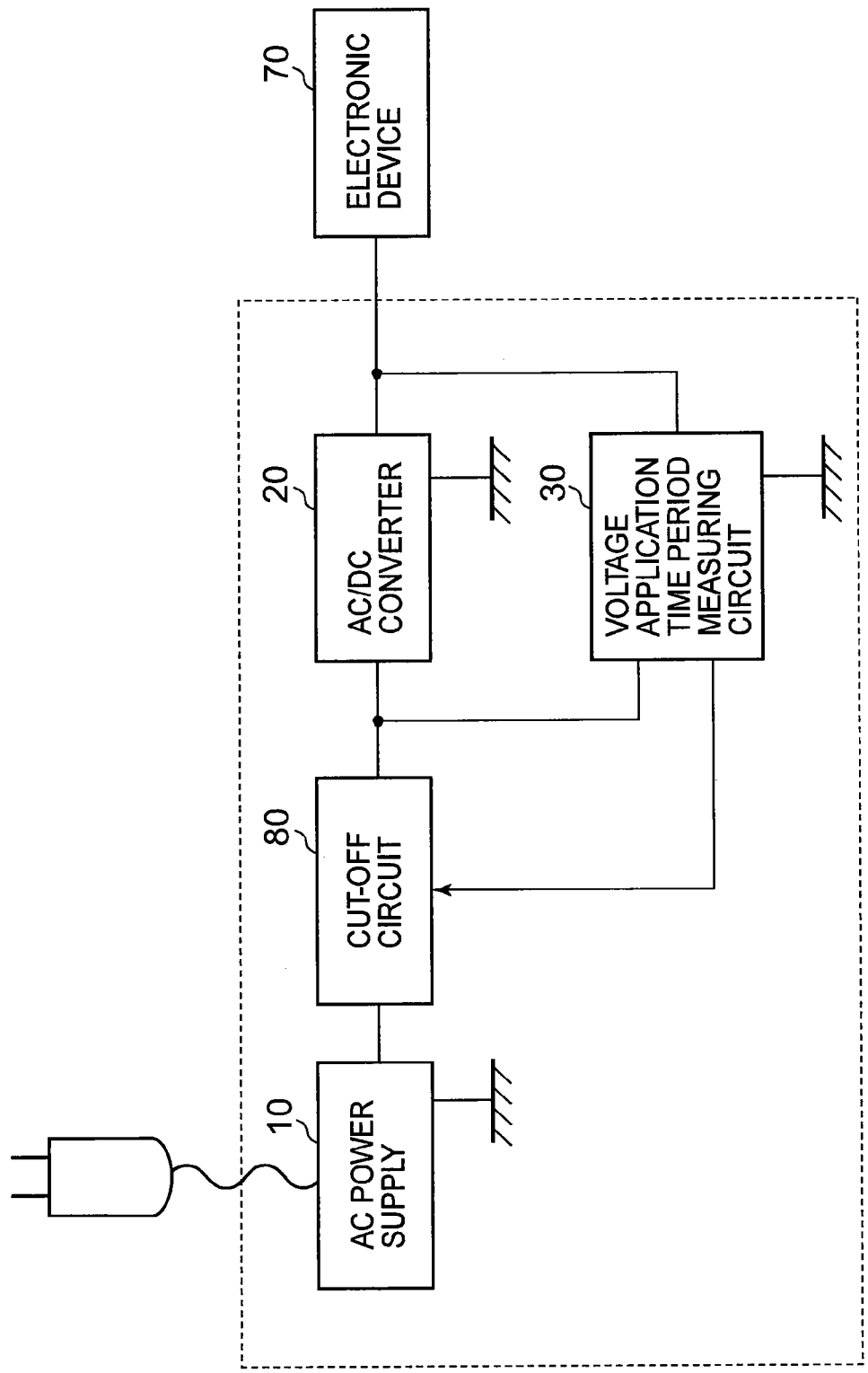

VOLTAGE APPLICATION TIME PERIOD MEASURING CIRCUIT AND POWER SUPPLY APPARATUS INCLUDING THE SAME

RELATED APPLICATIONS

This application claims priority under 35 U.S.C. §119 to Japanese Patent Application No. 2009-269247 filed on Nov. 26, 2009, the entire content of which is hereby incorporated by reference.

BACKGROUND OF THE INVENTION

1. Field of the Invention

The present invention relates to a voltage application time period measuring circuit including a semiconductor device, for measuring a voltage application time period of a voltage applied from a commercial power supply to an electronic device, and a power supply apparatus including the voltage application time period measuring circuit.

2. Description of the Related Art

A conventional voltage application time period measuring circuit is described. FIG. 17 illustrates the conventional voltage application time period measuring circuit.

When an electronic device (not shown) is connected to a commercial power supply (not shown), an alternating current voltage from the commercial power supply is input to a voltage application time period measuring circuit 100. Then, a zero-cross point detecting circuit 101 detects a zero-cross point of the alternating current voltage and generates a pulse signal. A counter 102 counts the pulse signal. A reference value setting circuit 103 has a predetermined reference value corresponding to a product life set therein. A comparator 104 compares the reference value from the reference value setting circuit 103 with a count value of the counter 102. When the count value is equal to or larger than the reference value, an output voltage of the comparator 104 is inverted, and hence it is determined that the life of the electronic device reaches the product life.

When the electronic device is disconnected from the commercial power supply, the counter value of the counter 102 is held by a backup battery 200 (see, for example, Japanese Patent No. 3264473).

However, the technology disclosed in Japanese Patent No. 3264473 requires the backup battery 200, and hence a power supply apparatus cost is increased correspondingly.

SUMMARY OF THE INVENTION

The present invention has been made in view of the problem described above. An object of the present invention is to provide a voltage application time period measuring circuit which does not require a battery, and a power supply apparatus including the voltage application time period measuring circuit.

In the present invention, in order to solve the problem described above, the voltage application time period measuring circuit and the power supply apparatus including the voltage application time period measuring circuit are provided as follows.

A voltage application time period measuring circuit for measuring a voltage application time period of a voltage applied from a commercial power supply to an electronic device, includes: a voltage monitoring circuit for monitoring a direct current power supply voltage supplied from an AC/DC converter based on an alternating current voltage from the commercial power supply, generating a connection signal when the electronic device is connected to the commercial power supply, and generating a disconnection signal when the electronic device is not connected to the commercial power supply; a counter for measuring the voltage application time period; a voltage application time period memory including a nonvolatile semiconductor device, for storing the voltage application time period; and a waveform shaping circuit for generating a square-wave voltage, in which when the connection signal is generated from the voltage monitoring circuit, the voltage application time period is read from the voltage application time period memory to the counter and measured by the counter based on the square-wave voltage, and when the voltage application time period reaches a preset voltage application time period, the voltage application time period measuring circuit generates a detection signal.

A power supply apparatus includes: an AC/DC converter for converting an alternating current voltage into a direct current voltage; an output terminal to which an output voltage from the AC/DC converter is supplied; and the voltage application time period measuring circuit.

According to the present invention, each of the voltage application time period memory and a set time period memory is a nonvolatile memory, and hence it is unnecessary to provide a battery for holding information stored in each of the memories in the outside of the voltage application time period measuring circuit and a power supply apparatus cost is reduced correspondingly.

BRIEF DESCRIPTION OF THE DRAWINGS

In the accompanying drawings:

FIG. 15 illustrates another example of the second embodiment of the power supply apparatus according to the present invention;

DETAILED DESCRIPTION OF THE PREFERRED EMBODIMENTS

Hereinafter, embodiments of the present invention are described with reference to the attached drawings.

First Embodiment

Figure 1:
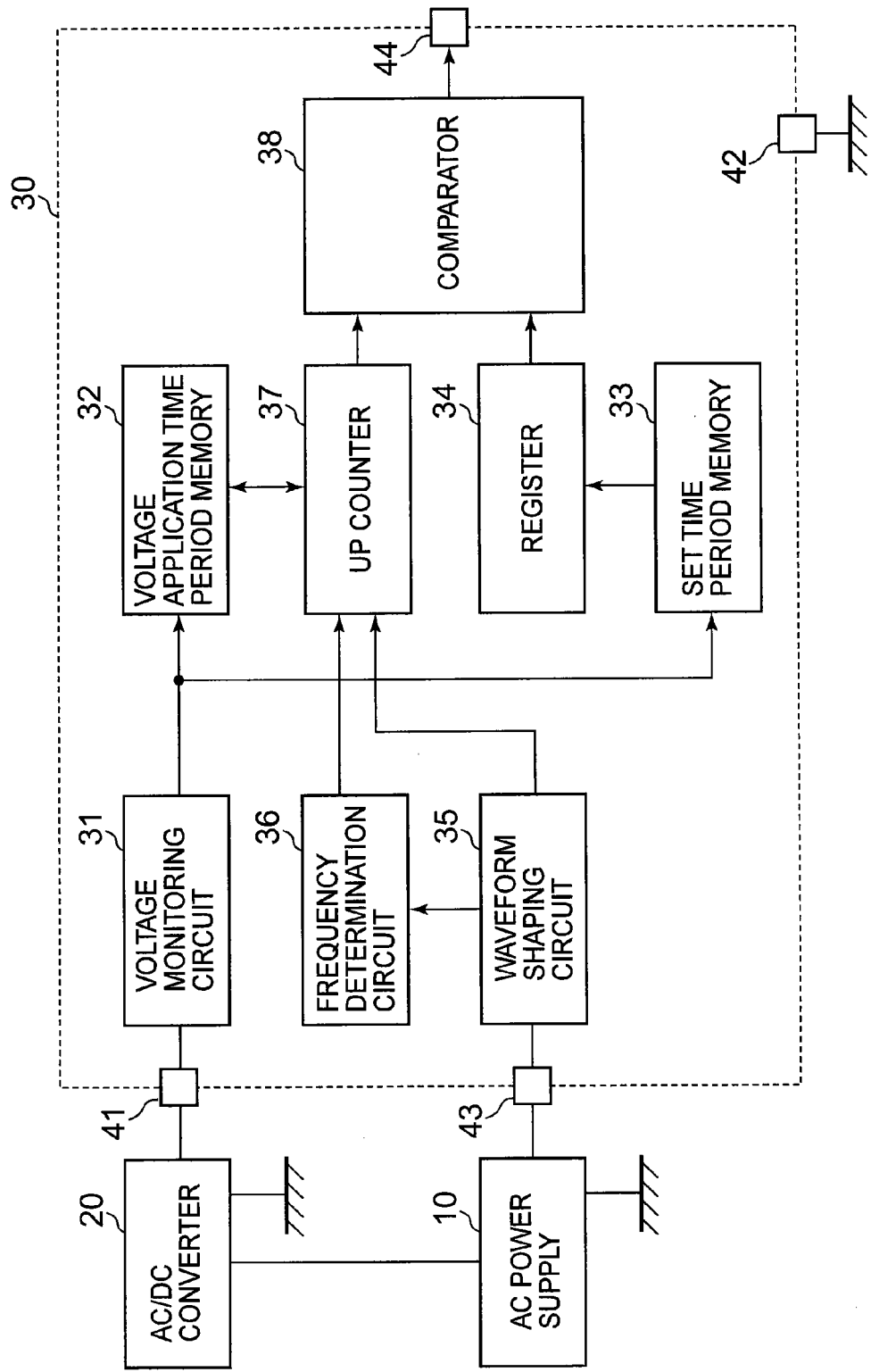
FIG. 1 illustrates a first embodiment of a voltage application time period measuring circuit according to the present invention.

A structure of a voltage application time period measuring circuit according to a first embodiment is described. FIG. 1 illustrates a voltage application time period measuring circuit 30 according to the first embodiment.

The voltage application time period measuring circuit 30 includes a voltage monitoring circuit 31, a voltage application time period memory 32, a set time period memory 33, a register 34, a waveform shaping circuit 35, a frequency determination circuit 36, an up counter 37, and a comparator 38. The voltage application time period measuring circuit 30 further includes a power supply terminal 41 connected to an AC/DC converter 20, a ground terminal 42, an input terminal 43 connected to an AC power supply 10, and an output terminal 44.

An input terminal of the waveform shaping circuit 35 is connected to the input terminal 43 and a first output terminal of the waveform shaping circuit 35 is connected to an input terminal of the frequency determination circuit 36. An input terminal of the voltage monitoring circuit 31 is connected to the power supply terminal 41, and an output terminal of the voltage monitoring circuit 31 is connected to an input terminal of the voltage application time period memory 32 and an input terminal of the set time period memory 33.

A first input terminal of the up counter 37 is connected to an output terminal of the frequency determination circuit 36, and a second input terminal of the up counter 37 is connected to a second output terminal of the waveform shaping circuit 35. A voltage application time period terminal of the up counter 37, which is used to read and write a voltage application time period from and into the voltage application time period memory 32, is connected to an input and output terminal of the voltage application time period memory 32. An output terminal of the up counter 37 is connected to a first input terminal of the comparator 38. A set time period terminal of the register 34, which is used to read a set time period from the set time period memory 33, is connected to an output terminal of the set time period memory 33. An output terminal of the register 34 is connected to a second input terminal of the comparator 38. An output terminal of the comparator 38 is connected to the output terminal 44.

Next, an operation of the voltage application time period measuring circuit 30 is described.

When a commercial power supply (not shown) is connected to an electronic device (not shown), the voltage application time period measuring circuit 30 operates at a voltage of the power supply terminal 41 as a power supply voltage. In this case, an alternating current voltage from the commercial power supply is subjected to voltage conversion by a transformer (not shown) included in the AC power source 10, and input to the AC/DC converter 20. The input alternating current voltage is converted into a direct current voltage by the AC/DC converter 20. The direct current voltage (power supply voltage for voltage application time period measuring circuit 30) is monitored by the voltage monitoring circuit 31. When the connection between the commercial power supply and the electronic device is detected, the voltage monitoring circuit 31 outputs a connection signal to the voltage application time period memory 32 and the set time period memory 33. Then, in response to the connection signal, when the voltage application time period measuring circuit 30 is in an initial state, the up counter 37 reads a count value of zero value from the voltage application time period memory 32. When the voltage application time period measuring circuit 30 is not in the initial state, the up counter 37 reads a count value indicating a total of elapsed voltage application time period of a voltage applied from the commercial power supply to the electronic device, in response to the connection signal. In other words, the voltage application time period memory 32 is a nonvolatile memory and stores the count value described above in advance. The register 34 reads, from the set time period memory 33, a set value indicating a maximum set time period allowable as a voltage application time period of a voltage applied from the commercial power supply to the electronic device. In other words, the set time period memory 33 is a nonvolatile memory and stores the set value described above in advance.

The alternating current voltage from the commercial power supply is subjected to voltage conversion by the transformer included in the AC power source 10 and input to the waveform shaping circuit 35. The waveform shaping circuit 35 shapes the alternating current voltage into a square-wave voltage, and outputs the square-wave voltage to the frequency determination circuit 36 and the up counter 37. The frequency determination circuit 36 determines whether a frequency of the alternating current voltage is 50 hertz or 60 hertz, and outputs a determination signal indicating a result obtained by the determination to the up counter 37. The up counter 37 counts up from the count value stored in advance in the voltage application time period memory 32, based on the square-wave voltage from the waveform shaping circuit 35 and the determination signal from the frequency determination circuit 36. In other words, the voltage application time period of the voltage applied from the commercial power supply to the electronic device is measured.

The comparator 38 constantly compares the count value of the up counter 37 with the set value of the register 34. When the count value becomes equal to or larger than the set value, an output voltage of the comparator 38 is inverted. In other words, when the total of the voltage application time period of the voltage applied from the commercial power supply to the electronic device is longer than a set time period, the output voltage of the comparator 38 is inverted.

When the electronic device and the commercial power supply are disconnected from each other, the voltage application time period measuring circuit 30 operates at a voltage charged into a capacitor (not shown) which is contained in the voltage application time period measuring circuit 30 or externally provided thereto, as a power supply voltage. In this case, the direct current voltage output from the AC/DC converter 20 becomes lower. Then, the connection between the commercial power supply and the electronic device cannot be detected, and hence the voltage monitoring circuit 31 outputs a disconnection signal to the voltage application time period memory 32. In response to the disconnection signal, a current count value of the up counter 37 is stored in the voltage application time period memory 32.

Therefore, each of the voltage application time period memory 32 and the set time period memory 33 is a nonvolatile memory, and hence it is unnecessary to provide a battery for holding information stored in each of the memories in the outside of the voltage application time period measuring circuit 30, and hence a power supply apparatus cost is reduced correspondingly. In addition, maintenance including battery exchange is not required. Further, a loss of information resulting from battery depletion is prevented.

Figure 2:
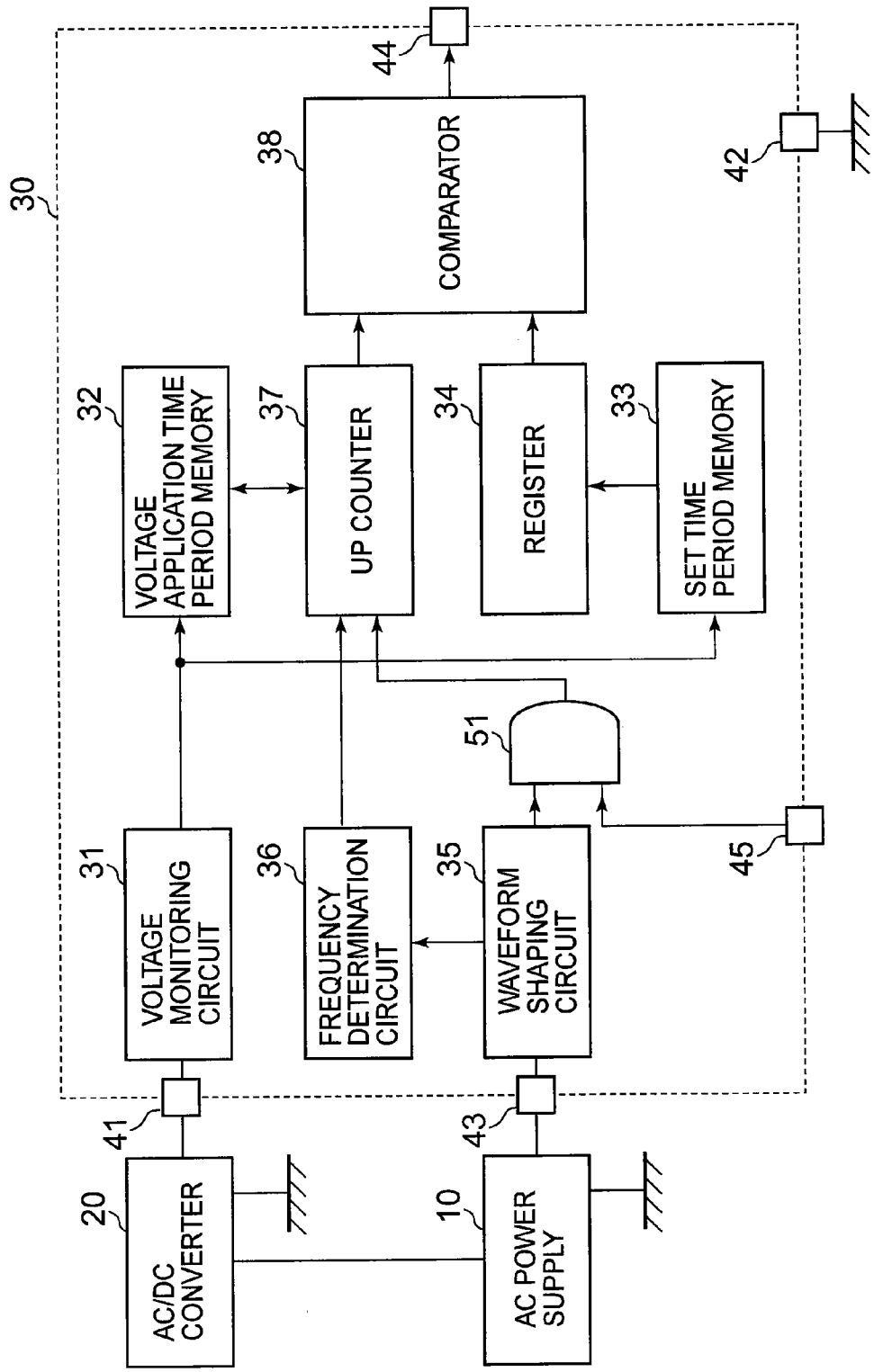
FIG. 2 illustrates another example of the first embodiment of the voltage application time period measuring circuit according to the present invention.

As illustrated in FIG. 2, unlike the voltage application time period measuring circuit 30 illustrated in FIG. 1, an AND circuit 51 and a control terminal 45 may further be provided. The AND circuit 51 includes a first input terminal connected to the second output terminal of the waveform shaping circuit 35, a second input terminal connected to the control terminal 45, and an output terminal connected to the second input terminal of the up counter 37.

When a voltage of the control terminal 45 is at a high level, the voltage application time period measuring circuit 30 illustrated in FIG. 2 performs the same operation as the voltage application time period measuring circuit 30 illustrated in FIG. 1. When the voltage of the control terminal 45 is reduced to a low level, an output voltage of the AND circuit 51 is forced to be reduced to a low level, and hence the square-wave voltage from the waveform shaping circuit 35 is not input to the up counter 37. Therefore, the count up operation of the up counter 37 is stopped. In other words, the measurement of the voltage application time period of the voltage applied from the commercial power supply to the electronic device is stopped.

Therefore, when the voltage of the control terminal 45 is arbitrarily controlled by a user, the voltage application time period measuring circuit 30 may arbitrarily start and stop the count up operation, and hence convenience for user is improved.

Figure 3:
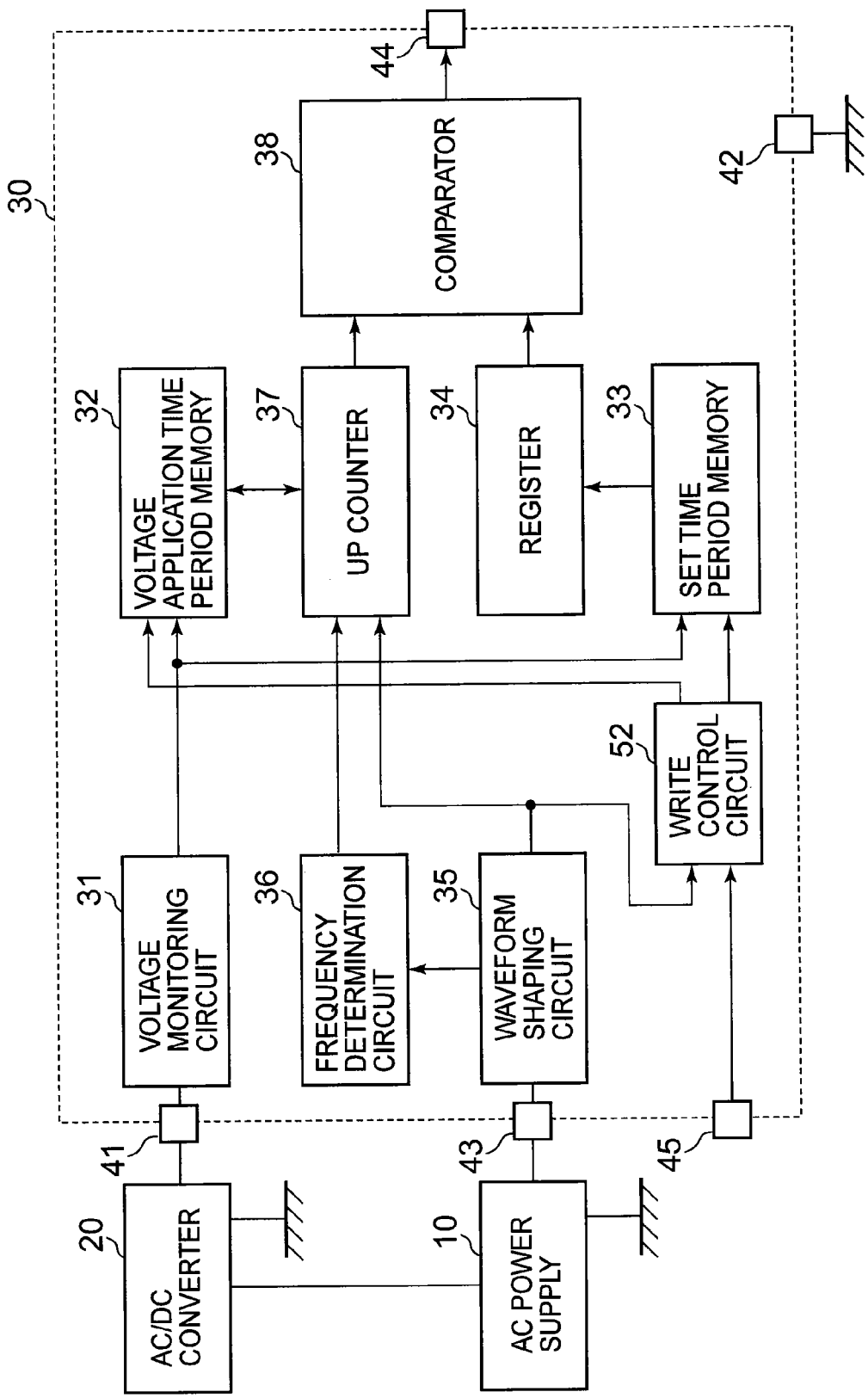
FIG. 3 illustrates another example of the first embodiment of the voltage application time period measuring circuit according to the present invention.

As illustrated in FIG. 3, unlike the voltage application time period measuring circuit 30 illustrated in FIG. 1, a write control circuit 52 and the control terminal 45 may further be provided. The write control circuit 52 includes a first input terminal connected to the second output terminal of the waveform shaping circuit 35, a second input terminal connected to the control terminal 45, the first output terminal connected to the control terminal of the voltage application time period memory 32, and a second output terminal connected to the control terminal of the set time period memory 33.

A control signal indicating the writing only into the voltage application time period memory 32, the writing only into the set time period memory 33, or no writing into both of the memories is input to the control terminal 45. After that, a data signal to be written into any one of the memories is input to the control terminal 45. The write control circuit 52 receives the control signal and the data signal based on the square-wave voltage from the waveform shaping circuit 35. Then, the following is performed by the write control circuit 52 based on the control signal and the data signal. That is, an arbitrary count value is written into the voltage application time period memory 32, an arbitrary set value is written into the set time period memory 33, or no values are written into both of the memories.

Therefore, the voltage of the control terminal 45 is arbitrarily controlled by a user, so that the count value of the voltage application time period memory 32 and the set value of the set time period memory 33 may be arbitrarily changed by the user. Thus, the voltage application time period measuring circuit 30 may be applied to a case where the set time period is changed by a version upgrade of an electronic device after initialization.

Further, in an acceleration test, when the voltage of the control terminal 45 is arbitrarily controlled by a user to increase the count value of the voltage application time period memory 32 or reduce the set value of the set time period memory 33, the test time period is shortened.

Figure 4:
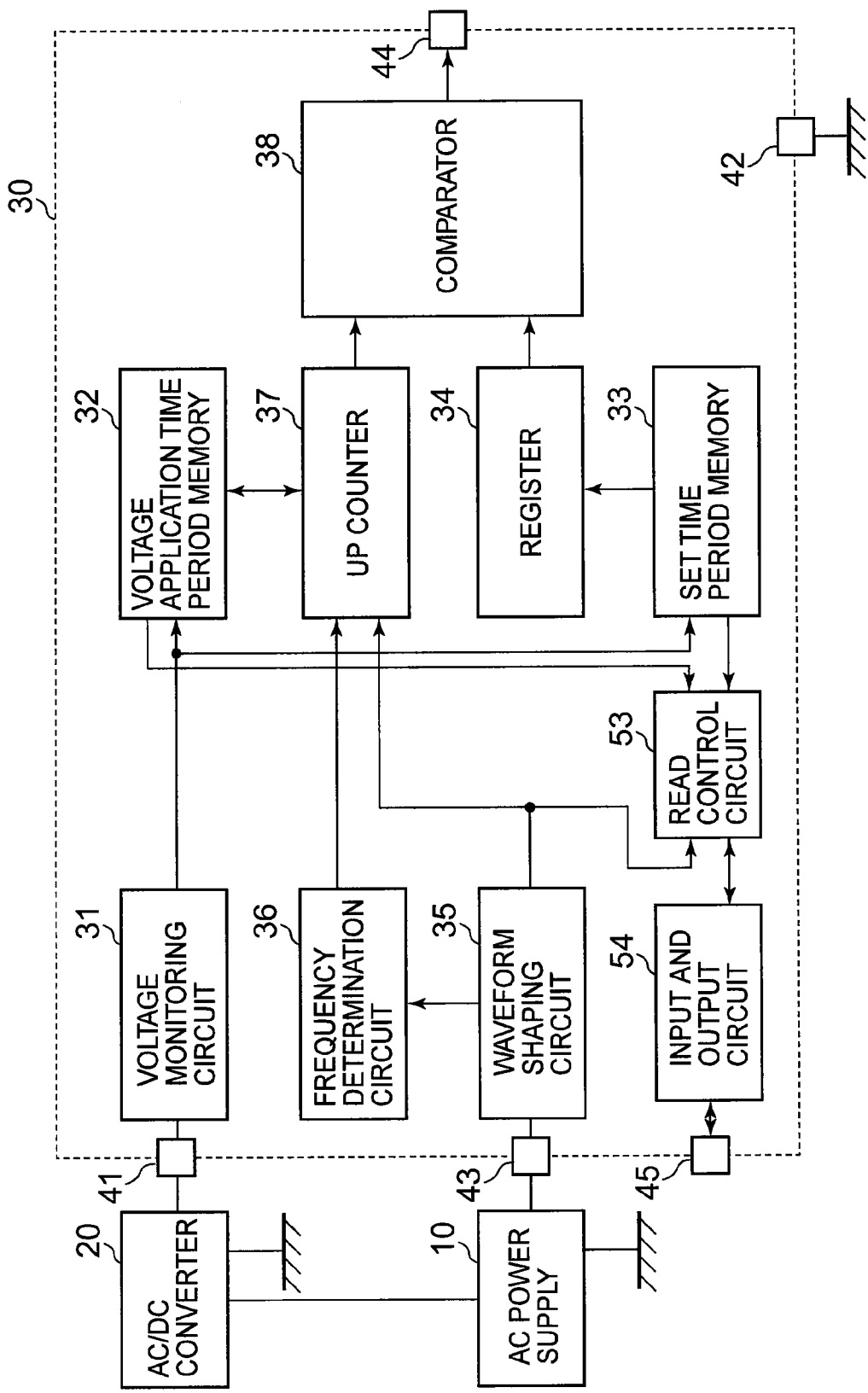
FIG. 4 illustrates another example of the first embodiment of the voltage application time period measuring circuit according to the present invention.

As illustrated in FIG. 4, unlike the voltage application time period measuring circuit 30 illustrated in FIG. 1, a read control circuit 53, an input and output circuit 54, and the control terminal 45 may further be provided. The read control circuit 53 includes a first input terminal connected to a control terminal of the voltage application time period memory 32, a second input terminal connected to a control terminal of the set time period memory 33, a third input terminal connected to the second output terminal of the waveform shaping circuit 35, and a control terminal connected to a control terminal of the input and output circuit 54. An input and output terminal of the input and output circuit 54 is connected to the control terminal 45.

A control signal indicating the reading only from the voltage application time period memory 32, the reading only from the set time period memory 33, or no reading from both of the memories is input to the control terminal of the read control circuit 53 through the control terminal 45 and the input and output circuit 54. The read control circuit 53 receives the control signal based on the square-wave voltage from the waveform shaping circuit 35. Then, the following is performed by the read control circuit 53 based on the control signal. That is, the count value of the voltage application time period memory 32 is read through the input and output circuit 54 and the control terminal 45, the set value of the set time period memory 33 is read through the input and output circuit 54 and the control terminal 45, or no values are read from both of the memories.

Therefore, the voltage of the control terminal 45 is arbitrarily controlled by a user, so that the count value of the voltage application time period memory 32 and the set value of the set time period memory 33 may be read by the user and determined. In other words, the user may always monitor a product life time and a maintenance time from the start of use of the product, namely, the electronic device.

The count value of the voltage application time period memory 32 and the set value of the set time period memory 33 may be stored in an external memory (not shown) together with read times of the count value and the set value. Therefore, the information stored in the external memory may be used to analyze the cause of trouble of the electronic device.

Figure 5:
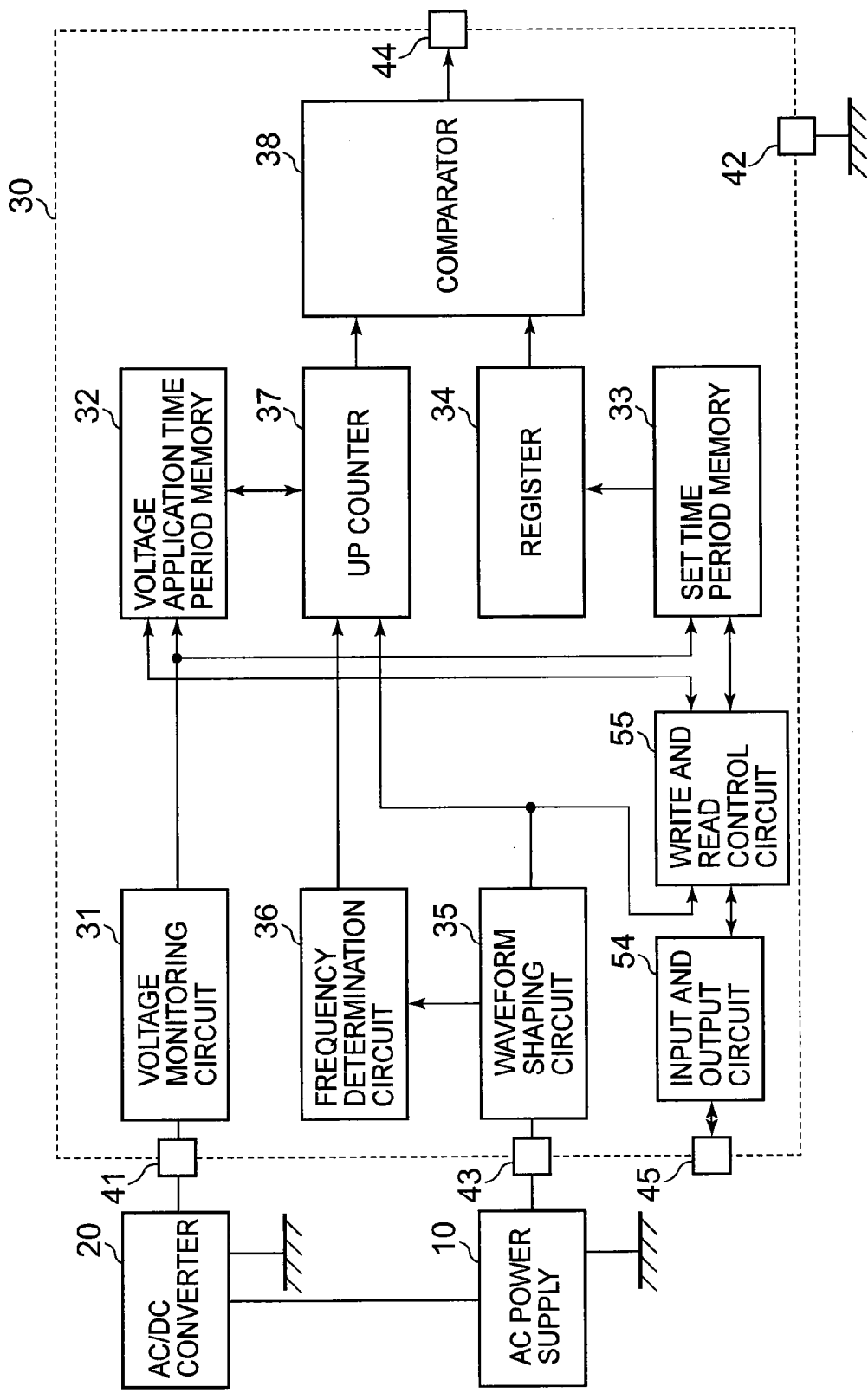
FIG. 5 illustrates another example of the first embodiment of the voltage application time period measuring circuit according to the present invention.

As illustrated in FIG. 5, unlike the voltage application time period measuring circuits 30 illustrated in FIGS. 3 and 4, a write and read control circuit 55 may be provided, which has both of the function of the write control circuit 52 illustrated in FIG. 3 and the function of the read control circuit 53 illustrated in FIG. 4 may be provided.

Figure 6:
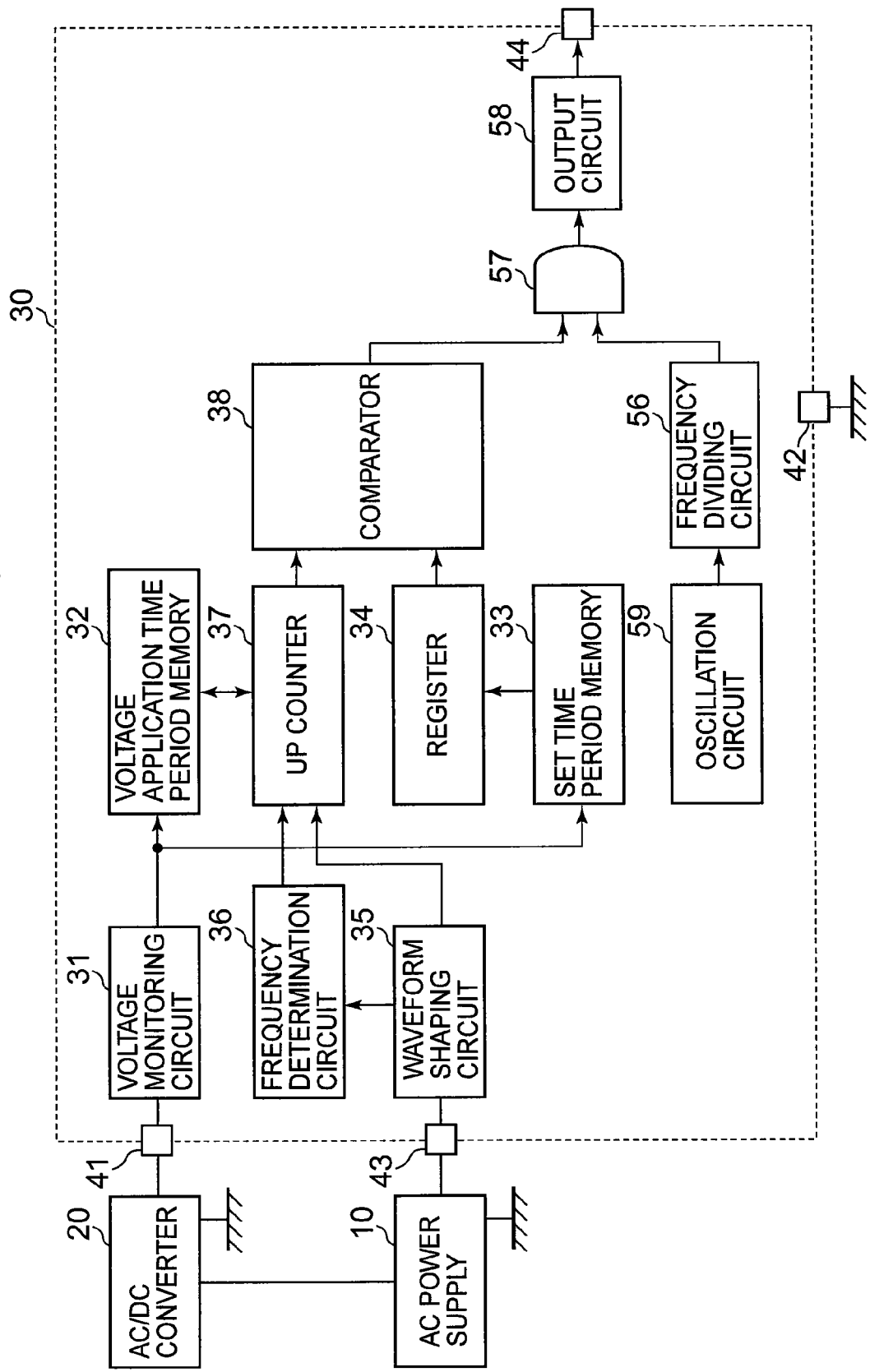
FIG. 6 illustrates another example of the first embodiment of the voltage application time period measuring circuit according to the present invention.

As illustrated in FIG. 6, unlike the voltage application time period measuring circuit 30 illustrated in FIG. 1, an oscillation circuit 59, a frequency dividing circuit 56, an AND circuit 57, and an output circuit 58 may further be provided. An output terminal of the oscillation circuit 59 is connected to an input terminal of the frequency dividing circuit 56. The AND circuit 57 includes a first input terminal connected to the output terminal of the comparator 38, a second input terminal connected to an output terminal of the frequency dividing circuit 56, and an output terminal connected to an input terminal of the output circuit 58. An output terminal of the output circuit 58 is connected to the output terminal 44.

The oscillation circuit 59 generates a clock signal which is a square-wave voltage. The frequency dividing circuit 56 divides the frequency of the clock signal to generate a frequency-divided clock signal having a predetermined period. When the total of the voltage application time period of the voltage applied from the commercial power supply to the electronic device is equal to or longer than the set time period and thus the output voltage of the comparator 38 is at a high level, the AND circuit 57 outputs the frequency-divided clock signal (pulse signal) as an output voltage. In other words, the frequency dividing circuit 56 and the AND circuit 57 serve as a control circuit for converting, into the pulse signal, the output voltage of the comparator 38 which indicates that the total of the voltage application time period of the voltage applied from the commercial power supply to the electronic device is equal to or longer than the set time period, based on the output voltage of the oscillation circuit 59. The output circuit 58 performs impedance conversion on the frequency-divided clock signal and outputs the signal. Note that, the circuit may be designed so that the oscillation circuit 59 and the frequency dividing circuit 56 stop operating when the output voltage of the comparator 38 is at the low level.

Therefore, for example, when an LED is provided as the output terminal of the voltage application time period measuring circuit 30, the LED flashes rather than being continuously lighted up, and hence a visual effect is enhanced.

Figure 7:
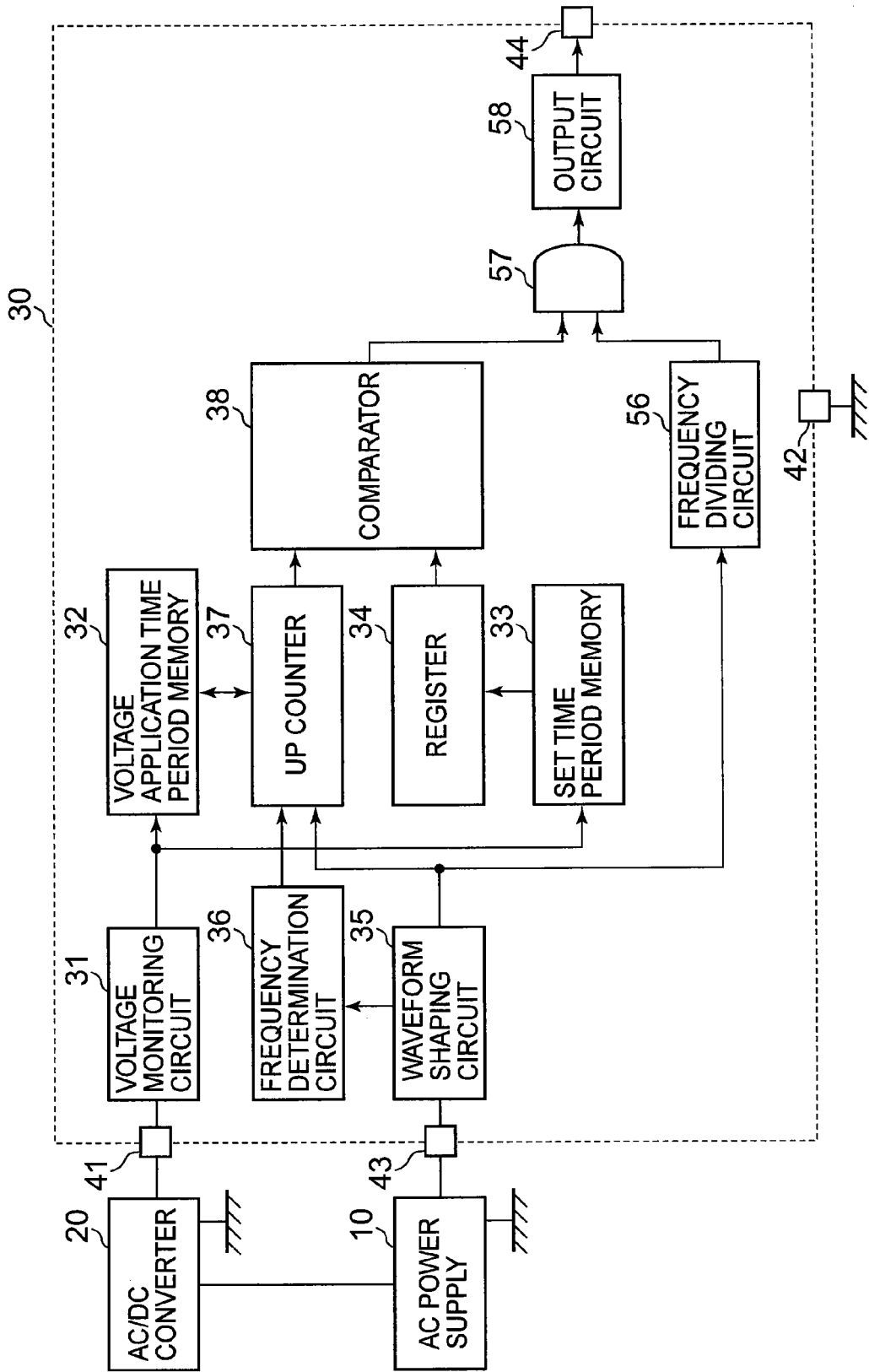
FIG. 7 illustrates another example of the first embodiment of the voltage application time period measuring circuit according to the present invention.

As illustrated in FIG. 7, unlike the voltage application time period measuring circuit 30 illustrated in FIG. 6, the oscillation circuit 59 may be omitted. The input terminal of the frequency dividing circuit 56 is connected to the second output terminal of the waveform shaping circuit 35.

The frequency dividing circuit 56 divides the frequency of the square-wave voltage from the waveform shaping circuit 35 to generate the frequency-divided clock signal having a predetermined period.

Therefore, the oscillation circuit 59 illustrated in FIG. 6 is unnecessary, and hence an area of the voltage application time period measuring circuit 30 is reduced correspondingly, to thereby lower the cost of the voltage application time period measuring circuit 30. In addition, current consumption of the voltage application time period measuring circuit 30 becomes smaller. Further, the number of internal noise sources of the voltage application time period measuring circuit 30 is reduced.

Figure 8:
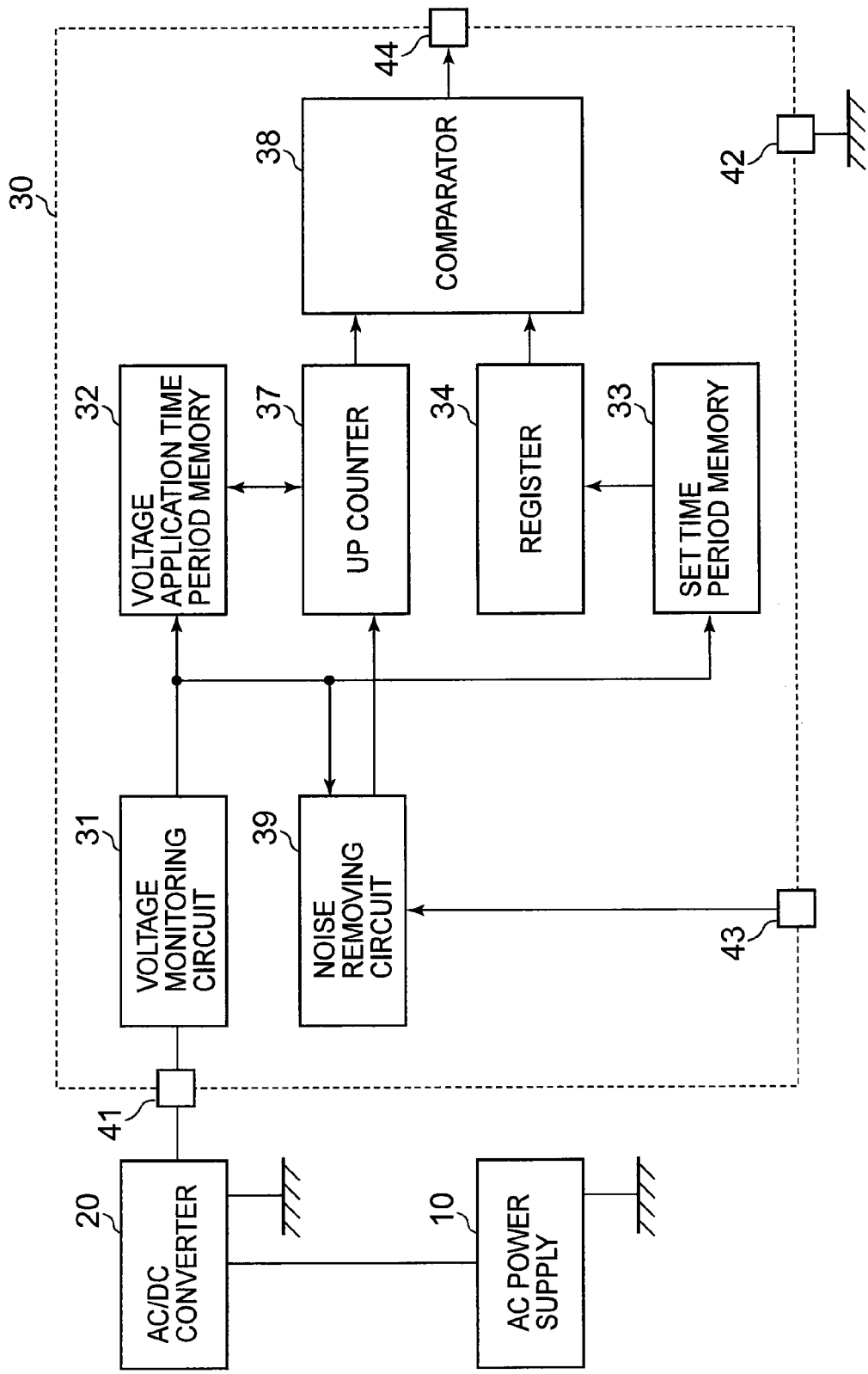
FIG. 8 illustrates another example of the first embodiment of the voltage application time period measuring circuit according to the present invention.

As illustrated in FIG. 8, unlike the voltage application time period measuring circuit 30 illustrated in FIG. 1, the waveform shaping circuit 35 and the frequency determination circuit 36 may be omitted, and a noise removing circuit 39 may further be provided. The noise removing circuit 39 includes a first input terminal connected to the input terminal 43, a second input terminal connected to the output terminal of the voltage monitoring circuit 31, and an output terminal connected to the second input terminal of the up counter 37.

A square-wave voltage from an oscillation circuit (not shown) provided outside the voltage application time period measuring circuit 30 is input to the noise removing circuit 39 through the input terminal 43 to remove a noise component. When the connection between the commercial power supply and the electronic device is detected, the voltage monitor circuit 31 outputs the connection signal to the noise removing circuit 39. Then, the noise removing circuit 39 outputs the square-wave voltage to the up counter 37. The up counter 37 counts up from the count value stored in advance in the voltage application time period memory 32 based on the square-wave voltage from the noise removing circuit 39.

Therefore, an arbitrarily square-wave voltage is easily selected by a user, and hence convenience of users is improved.

Figure 9:
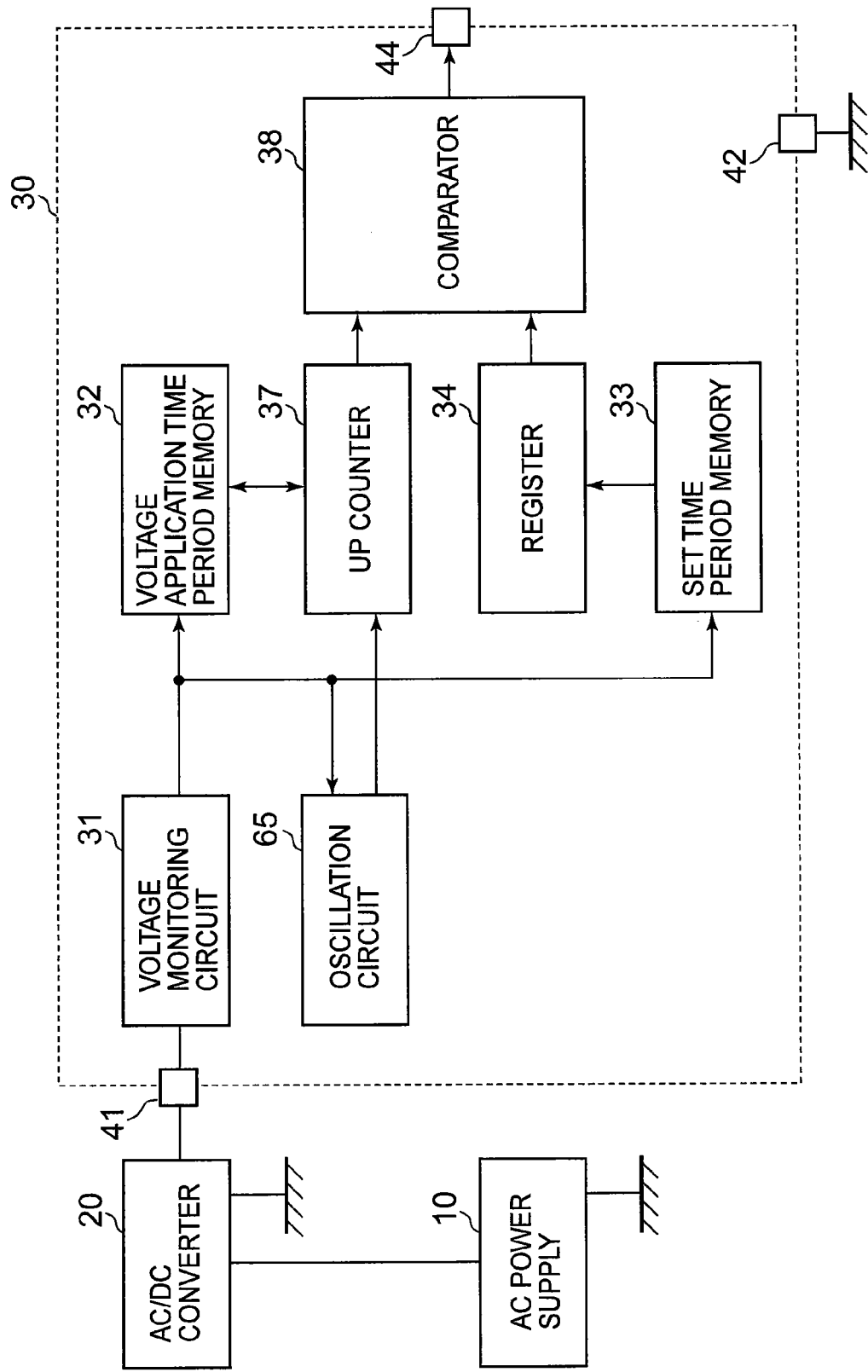
FIG. 9 illustrates another example of the first embodiment of the voltage application time period measuring circuit according to the present invention.

As illustrated in FIG. 9, unlike the voltage application time period measuring circuit 30 illustrated in FIG. 8, the noise removing circuit 39 may be omitted, and an oscillation circuit 65 may further be provided. The oscillation circuit 65 includes an input terminal connected to the output terminal of the voltage monitor circuit 31 and an output terminal connected to the second input terminal of the up counter 37.

When the connection between the commercial power supply and the electronic device is detected, the voltage monitor circuit 31 outputs the connection signal to the oscillation circuit 65. Then, the oscillation circuit 65 outputs a square-wave voltage to the up counter 37.

With this configuration, the input terminal 43 is unnecessary.

The AC/DC converter 20 is provided outside the voltage application time period measuring circuit 30 in each of the cases illustrated in FIGS. 1 to 9. Although not illustrated, the AC/DC converter 20 may be provided inside the voltage application time period measuring circuit 30.

Second Embodiment

Figure 10:
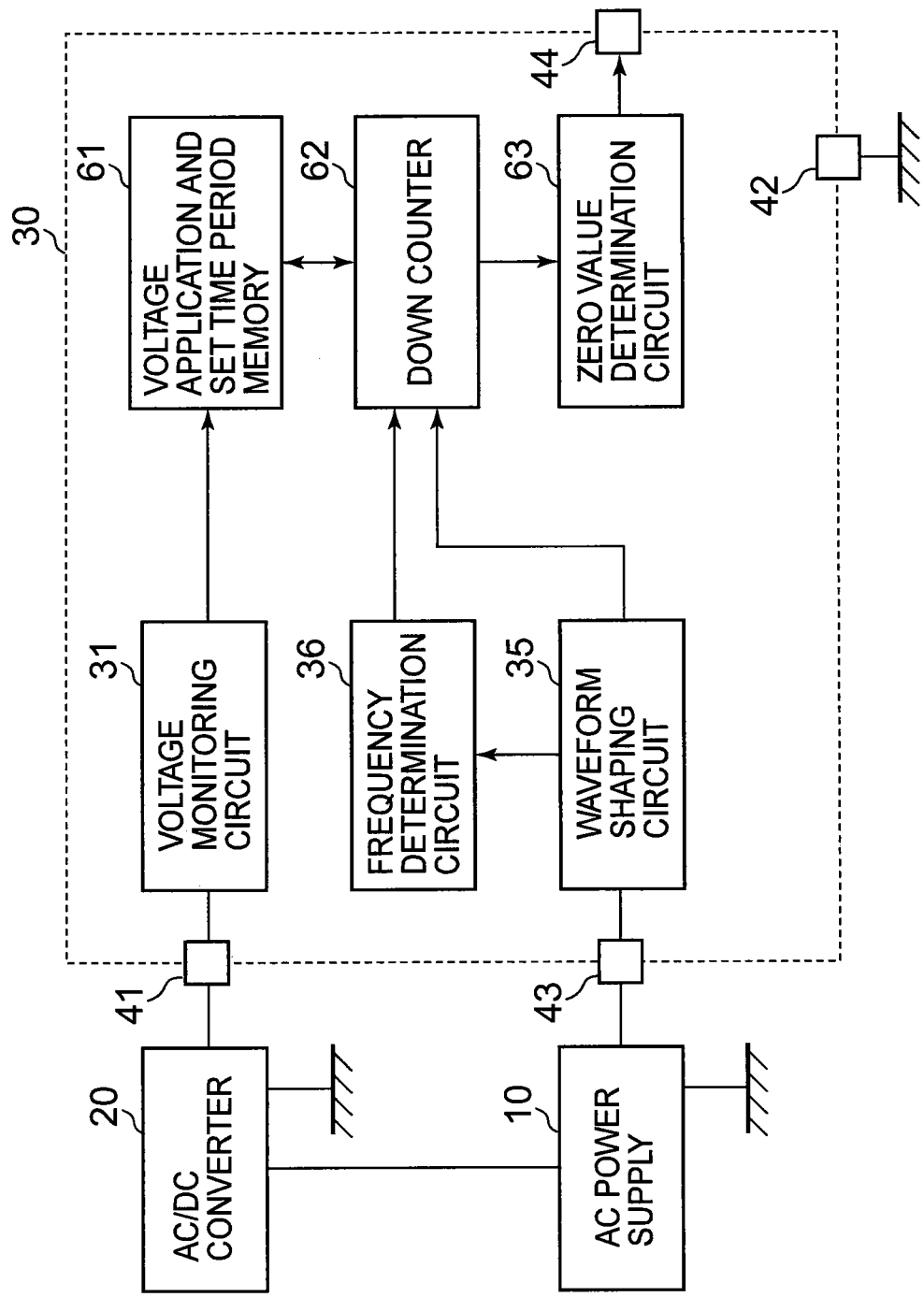
FIG. 10 illustrates a second embodiment of a voltage application time period measuring circuit according to the present invention.

A structure of a voltage application time period measuring circuit according to a second embodiment is described. FIG. 10 illustrates the voltage application time period measuring circuit 30 according to the second embodiment.

The voltage application time period measuring circuit 30 includes the voltage monitoring circuit 31, a voltage application and set time period memory 61, the waveform shaping circuit 35, the frequency determination circuit 36, a down counter 62, and a zero value determination circuit 63. The voltage application time period measuring circuit 30 further includes the power supply terminal 41 connected to the AC/DC converter 20, the ground terminal 42, the input terminal 43 connected to the AC power supply 10, and the output terminal 44.

An input terminal of the waveform shaping circuit 35 is connected to the input terminal 43 and a first output terminal thereof is connected to an input terminal of the frequency determination circuit 36. An input terminal of the voltage monitoring circuit 31 is connected to the power supply terminal 41 and an output terminal of the voltage monitoring circuit 31 is connected to an input terminal of the voltage application and set time period memory 61.

A first input terminal of the down counter 62 is connected to an output terminal of the frequency determination circuit 36 and a second input terminal of the frequency determination circuit 36 is connected to a second output terminal of the waveform shaping circuit 35. A voltage application and set time period terminal, which is used to read and write a voltage application time period from and into or to read a set time period from the voltage application and set time period memory 61, is connected to an input and output terminal of the voltage application and set time period memory 61. An output terminal of the down counter 62 is connected to an input terminal of the zero value determination circuit 63. An output terminal of the zero value determination circuit 63 is connected to the output terminal 44.

Next, an operation of the voltage application time period measuring circuit 30 is described.

When a commercial power supply (not shown) is connected to an electronic device (not shown), the voltage application time period measuring circuit 30 operates at a voltage of the power supply terminal 41 as a power supply voltage. In this case, an alternating current voltage from the commercial power supply is subjected to voltage conversion by a transformer (not shown) included in the AC power source 10 and input to the AC/DC converter 20. The input alternating current voltage is converted into a direct current voltage by the AC/DC converter 20. The direct current voltage (power supply voltage for voltage application time period measuring circuit 30) is monitored by the voltage monitoring circuit 31. When the connection between the commercial power supply and the electronic device is detected, the voltage monitoring circuit 31 outputs a connection signal to the voltage application and set time period memory 61. Then, in response to the connection signal, when the voltage application time period measuring circuit 30 is in an initial state, the down counter 62 reads, as a count value, a set value indicating a maximum set time period allowable as a voltage application time period of a voltage applied from the commercial power supply to the electronic device from the voltage application and set time period memory 61. When the voltage application time period measuring circuit 30 is not in the initial state, the down counter 62 reads a count value indicating a total of elapsed voltage application time period of a voltage applied from the commercial power supply to the electronic device, in response to the connection signal. In other words, the voltage application and set time period memory 61 is a nonvolatile memory, and stores the set value and the count value described above in advance. The alternating current voltage from the commercial power supply is subjected to voltage conversion by the transformer included in the AC power source 10 and input to the waveform shaping circuit 35. The waveform shaping circuit 35 shapes the alternating current voltage into a square-wave voltage and outputs the square-wave voltage to the frequency determination circuit 36 and the down counter 62. The frequency determination circuit 36 determines whether a frequency of the alternating current voltage is 50 hertz or 60 hertz, and outputs a determination signal indicating a result obtained by the determination to the down counter 62. The down counter 62 counts down from the count value stored in advance in the voltage application and set time period memory 61, based on the square-wave voltage from the waveform shaping circuit 35 and the determination signal from the frequency determination circuit 36. In other words, the voltage application time period of the voltage applied from the commercial power supply to the electronic device is measured.

The zero value determination circuit 63 constantly monitors the count value of the down counter 62. When the count value becomes a zero value, an output voltage of the zero value determination circuit 63 is inverted. In other words, when the total of the voltage application time period of the voltage applied from the commercial power supply to the electronic device is longer than a set time period, the output voltage of the zero value determination circuit 63 is inverted.

When the electronic device and the commercial power supply are disconnected from each other, the voltage application time period measuring circuit 30 operates at a voltage charged into a capacitor (not shown) which is contained in the voltage application time period measuring circuit 30 or externally provided thereto, as a power supply voltage. In this case, the direct current voltage output from the AC/DC converter 20 becomes lower. Then, the connection between the commercial power supply and the electronic device cannot be detected, and hence the voltage monitoring circuit 31 outputs a disconnection signal to the voltage application and set time period memory 61. In response to the disconnection signal, a current count value of the down counter 62 is stored in the voltage application and set time period memory 61.

Therefore, the count value of the voltage application and set time period memory 61 indicates both the voltage application time period and the set time period, and hence a memory capacity of the voltage application time period measuring circuit 30 is reduced. In addition, the register 34 illustrated in each of FIGS. 1 to 9 is unnecessary, and hence the area of the voltage application time period measuring circuit 30 is reduced by a corresponding area, to thereby lower the cost of the voltage application time period measuring circuit 30. Further, current consumption of the voltage application time period measuring circuit 30 becomes smaller.

Although not illustrated, the AND circuit 51 to the voltage application time period measuring circuit as illustrated in FIG. 2 in the first embodiment may be provided between the control terminal and the counter.

Although not illustrated, the additional circuit to the voltage application time period measuring circuit as illustrated in FIGS. 3 to 5 in the first embodiment may be provided between the control terminal and the memory.

Although not illustrated, the additional circuits to the voltage application time period measuring circuit as illustrated in FIGS. 6 and 7 in the first embodiment may be to the output terminal 44.

Although not illustrated, the additional circuits to the voltage application time period measuring circuit as illustrated in FIGS. 8 and 9 in the first embodiment may be provided in a preceding stage of the down counter 62.

The AC/DC converter 20 is provided outside the voltage application time period measuring circuit 30 in the case illustrated in FIG. 10. Although not illustrated, the AC/DC converter 20 may be provided inside the voltage application time period measuring circuit 30.

Next, embodiments of a power supply apparatus including the voltage application time period measuring circuit 30 according to the present invention are described with reference to the drawings.

<First Embodiment of Power Supply Apparatus>

Figure 11:
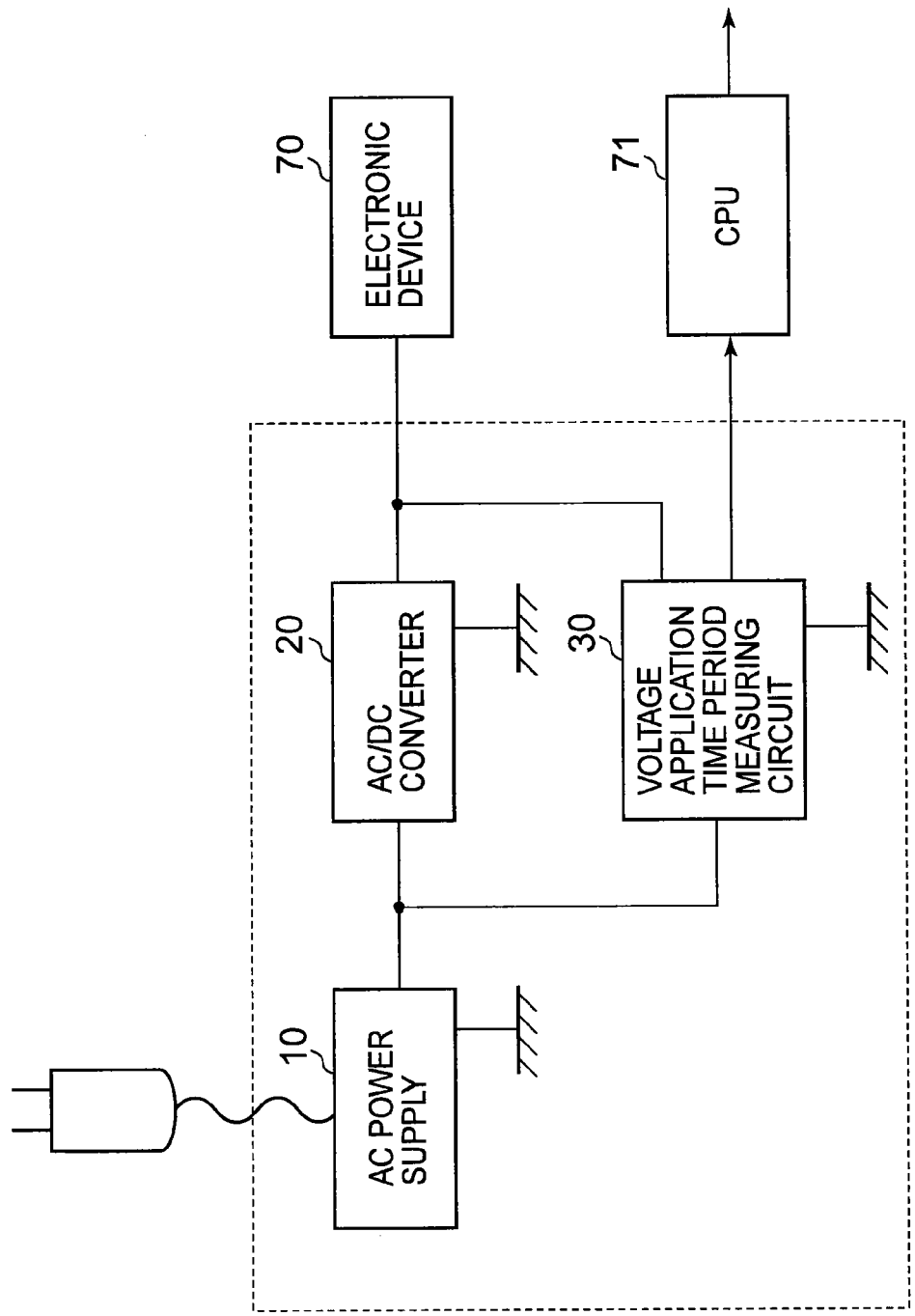
FIG. 11 illustrates a first embodiment of a power supply apparatus according to the present invention.

FIG. 11 illustrates a first embodiment of the power supply apparatus.

The power supply apparatus includes the AC power supply 10, AC/DC converter 20, and the voltage application time period measuring circuit 30. In FIG. 11, a CPU 71 is provided outside the power supply apparatus. Although not illustrated, the CPU 71 may be provided inside the power supply apparatus.

An output terminal of the commercial power supply is connected to an input terminal of the AC power supply 10. An input terminal of the AC/DC converter 20 is connected to the output terminal of the AC power supply 10 and to the input terminal of the voltage application time period measuring circuit 30, and an output terminal of the AC/DC converter 20 is connected to a power supply terminal of the electronic device 70 and the power supply terminal of the voltage application time period measuring circuit 30. A control terminal of the CPU 71 is connected to the output terminal of the voltage application time period measuring circuit 30.

When the total of the voltage application time period of the voltage applied from the commercial power supply to the electronic device 70 is longer than the set time period as in the case of the voltage application time period measuring circuit 30 according to each of the first and second embodiments, the output voltage of the voltage application time period measuring circuit 30 is inverted. Then, the CPU 71 stops the operation thereof, stops the operation of another circuit, or transmits a cut-off signal for cutting off the supply of power to another circuit.

Figure 12:
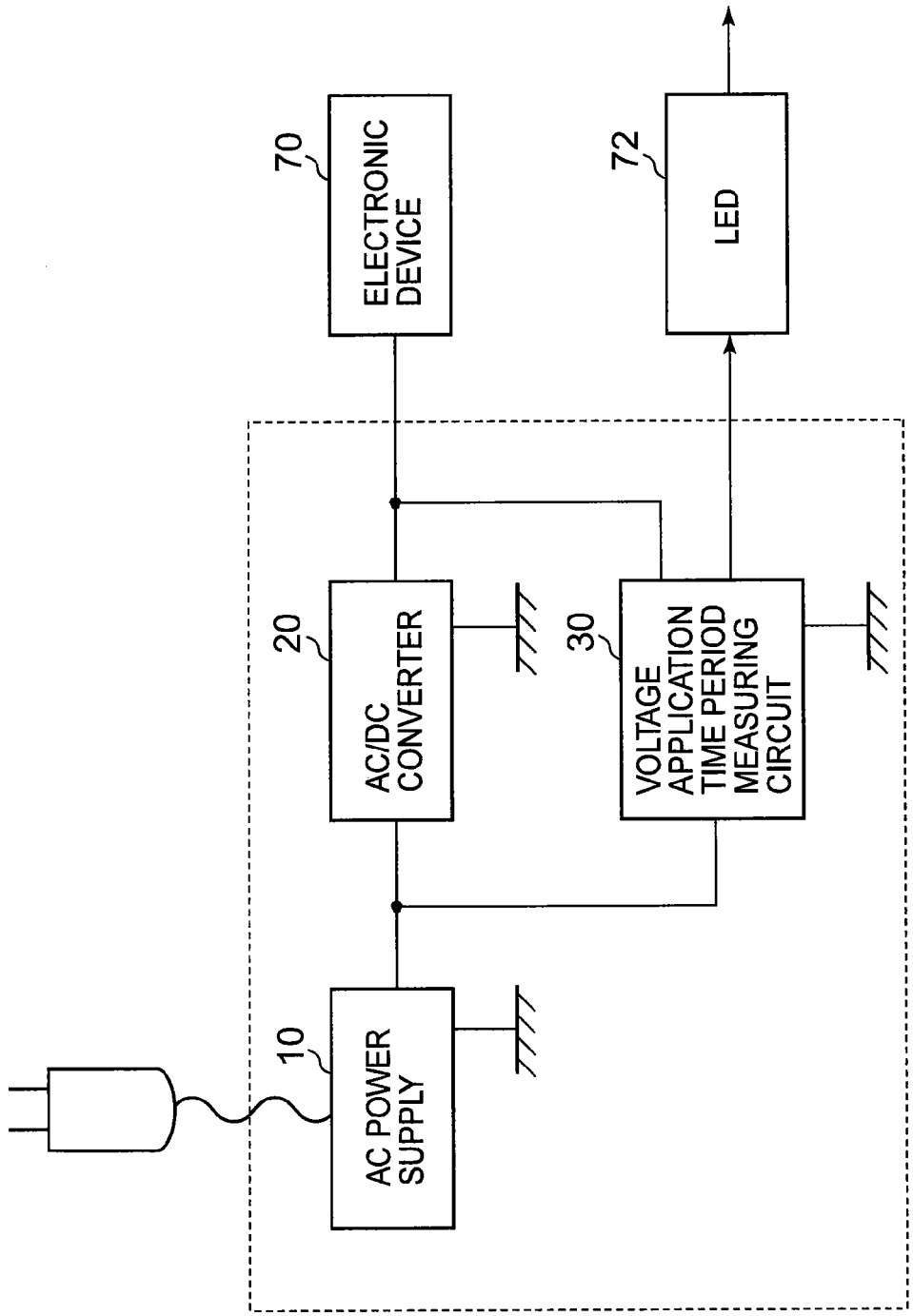
FIG. 12 illustrates another example of the first embodiment of the power supply apparatus according to the present invention.

As illustrated in FIG. 12, unlike the power supply apparatus illustrated in FIG. 11, the CPU 71 may be omitted and an LED 72 may further be provided outside the power supply apparatus. In FIG. 12, the LED 72 is provided outside the power supply apparatus. Although not illustrated, the LED 72 may be provided inside the power supply apparatus. A control terminal of the LED 72 is connected to the output terminal of the voltage application time period measuring circuit 30.

When the total of the voltage application time period of the voltage applied from the commercial power supply to the electronic device 70 is longer than the set time period as in the case of the voltage application time period measuring circuit 30 according to each of the first and second embodiments, the output voltage of the voltage application time period measuring circuit 30 is inverted. Then, the LED 72 lights up or flashes.

Figure 13:
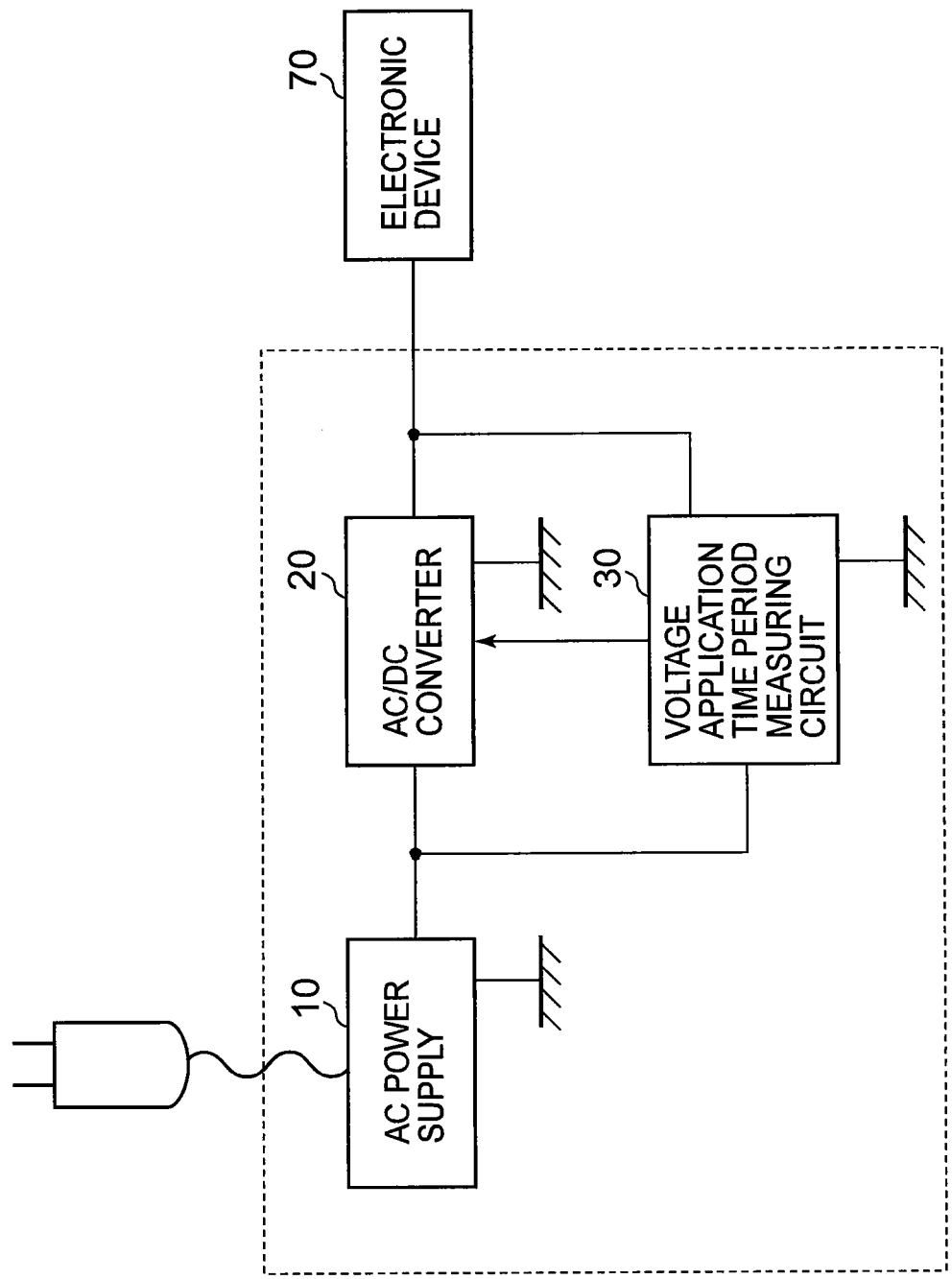
FIG. 13 illustrates another example of the first embodiment of the power supply apparatus according to the present invention.

As illustrated in FIG. 13, unlike the power supply apparatus illustrated in FIG. 11, the CPU 71 may be omitted. An on and off control terminal of the AC/DC converter 20 is connected to an output terminal of the voltage application time period measuring circuit 30.

When the total of the voltage application time period of the voltage applied from the commercial power supply to the electronic device 70 is longer than the set time period as in the case of the voltage application time period measuring circuit 30 according to each of the first and second embodiments, the output voltage of the voltage application time period measuring circuit 30 is inverted. Then, the AC/DC converter 20 is turned off by a switch (not shown) for on/off-controlling the AC/DC converter 20, which is provided at the on and off control terminal of the AC/DC converter 20.

The AC/DC converter 20 is provided outside the voltage application time period measuring circuit 30 in the case illustrated in FIGS. 11 to 13. Although not illustrated, however, the AC/DC converter 20 may be provided inside the voltage application time period measuring circuit 30.

<Second Embodiment of Power Supply Apparatus>

Figure 14:
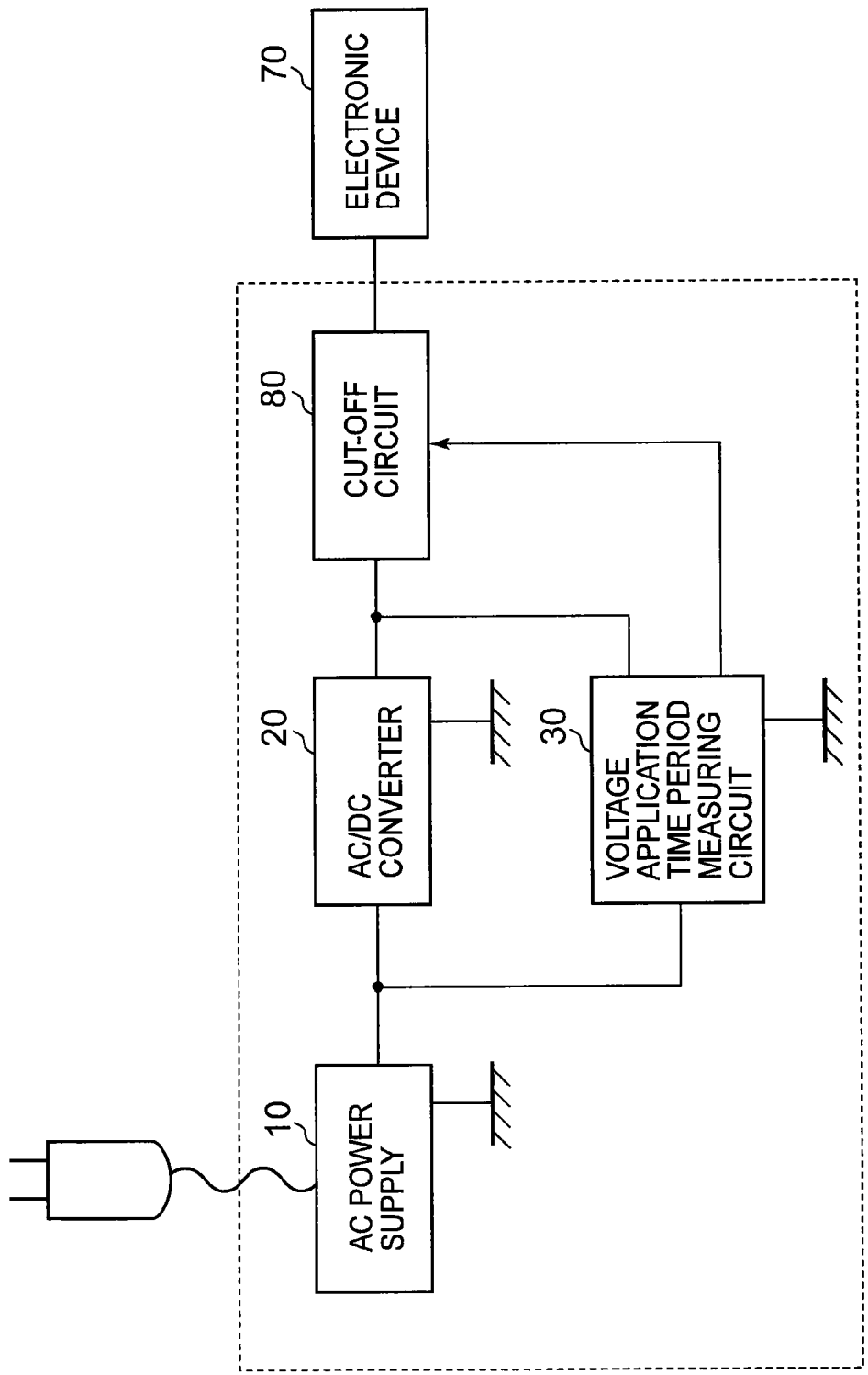
FIG. 14 illustrates a second embodiment of a power supply apparatus according to the present invention.

FIG. 14 illustrates a second embodiment of the power supply apparatus.

The power supply apparatus includes a cut-off circuit 80, the AC power supply 10, the AC/DC converter 20, and the voltage application time period measuring circuit 30.

The output terminal of the commercial power supply is connected to the input terminal of the AC power supply 10. The input terminal of the AC/DC converter 20 is connected to the output terminal of the AC power supply 10 and to the input terminal of the voltage application time period measuring circuit 30, and the output terminal of the AC/DC converter 20 is connected to the power supply terminal of the electronic device 70 through the cut-off circuit 80, and to the power supply terminal of the voltage application time period measuring circuit 30. An on and off control terminal of the cut-off circuit 80 is connected to the output terminal of the voltage application time period measuring circuit 30.

When the total of the voltage application time period of the voltage applied from the commercial power supply to the electronic device 70 is longer than the set time period as in the case of the voltage application time period measuring circuit 30 according to each of the first and second embodiments, the output voltage of the voltage application time period measuring circuit 30 is inverted. Then, the cut-off circuit 80 provided on a power supply path between the commercial power supply and the electronic device 70 is turned off to cut off the supply of power.

Figure 16A:
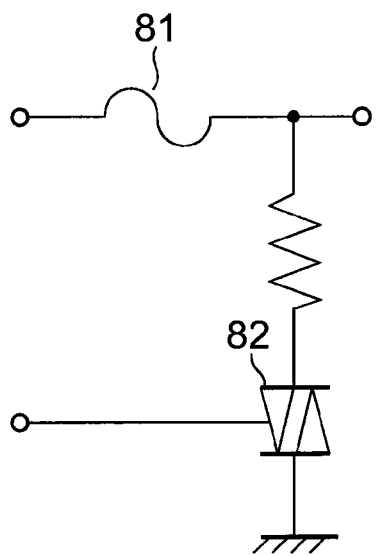
FIGS. 16A, 16B, and 16C illustrate examples of a cut-off circuit in the second embodiment of the power supply apparatus according to the present invention.
Figure 16B:
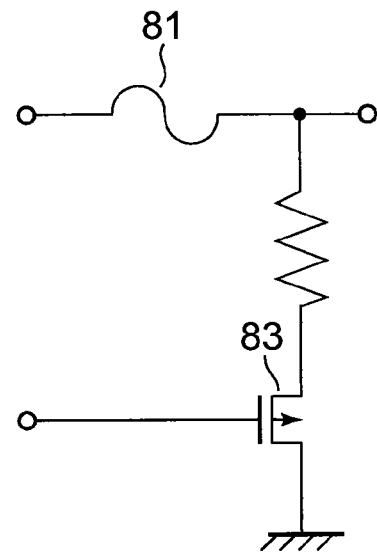
Figure 16C:
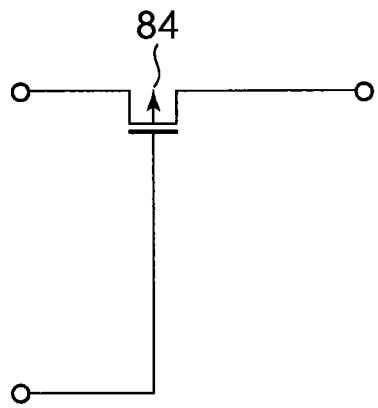
Figure 17:
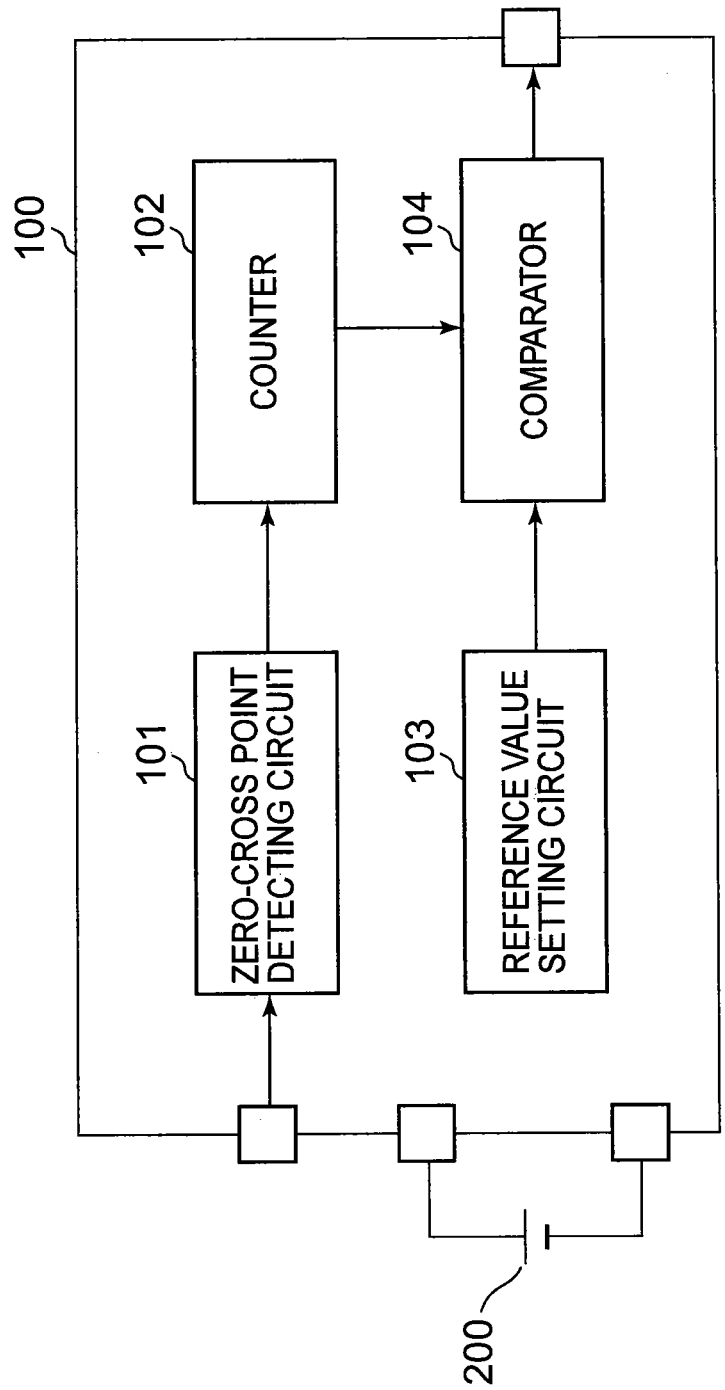
FIG. 17 illustrates a conventional voltage application time period measuring circuit.

FIGS. 16A, 16B, and 16C illustrate circuit examples of the cut-off circuit 80 in the second embodiment of the power supply apparatus. The cut-off circuit 80 includes a fuse or a switch which is provided to on/off-control the cut-off circuit 80 in response to a signal supplied to the on and off control terminal. In the cut-off circuit 80 illustrated in FIG. 16A, when a current flows into a triac 82, the current flows through a fuse 81, to thereby blow the fuse 81. In the cut-off circuit 80 illustrated in FIG. 16B, when a transistor 83 which is a MOS transistor or a bipolar transistor is turned on and a current flows thereinto, the current flows through the fuse 81, to thereby blow the fuse 81. In the cut-off circuit 80 illustrated in FIG. 16C, a transistor 84 which is a MOS transistor or a bipolar transistor is turned off.

In FIG. 14, the cut-off circuit 80 is provided between the AC/DC converter 20 and the electronic device 70. However, as illustrated in FIG. 15, the cut-off circuit 80 may be provided between the AC power supply 10 and the AC/DC converter 20. When the supply of power is cut off, the operation of the AC/DC converter 20 is necessarily stopped, and hence the current consumption of the power supply apparatus is easily reduced by a corresponding current.

The AC/DC converter 20 is provided outside the voltage application time period measuring circuit 30 in the cases illustrated in FIGS. 14 and 15. Although not illustrated, the AC/DC converter 20 may be provided inside the voltage application time period measuring circuit 30.

What is claimed is:

1. A voltage application time period measuring circuit for measuring a voltage application time period of a voltage applied from a commercial power supply to an electronic device, comprising:

a voltage monitoring circuit for monitoring a direct current power supply voltage supplied from an AC/DC converter based on an alternating current voltage from the commercial power supply, generating a connection signal when the electronic device is connected to the commercial power supply, and generating a disconnection signal when the electronic device is not connected to the commercial power supply;

a counter for measuring the voltage application time period;

a voltage application time period memory including a non-volatile semiconductor device, for storing the voltage application time period; and a waveform shaping circuit for generating a square-wave voltage, wherein when the connection signal is generated from the voltage monitoring circuit, the voltage application time period is read from the voltage application time period memory to the counter and measured by the counter based on the square-wave voltage, and when the voltage application time period reaches a preset voltage application time period, the voltage application time period measuring circuit generates a detection signal.

2. A voltage application time period measuring circuit according to claim 1, further comprising a frequency determination circuit for determining whether a frequency of the alternating current voltage is 50 Hz or 60 Hz and generating a determination signal, wherein:

the waveform shaping circuit shapes the alternating current voltage into the square-wave voltage; and the counter measures the voltage application time period based on the square-wave voltage and the determination signal.

3. A voltage application time period measuring circuit according to claim 1, wherein:

the waveform shaping circuit comprises a first oscillation circuit and shapes an oscillation voltage from the first oscillation circuit into the square-wave voltage; and the counter measures the voltage application time period based on the square-wave voltage.

4. A voltage application time period measuring circuit according to claim 1, further comprising:
- a set time period memory including a nonvolatile semiconductor device, for storing a set time period; and
- a write control circuit for controlling writing into the set time period memory, wherein:
- the voltage application time period measuring circuit compares the voltage application time period stored in the voltage application time period memory with the set time period stored in the set time period memory to detect whether or not the voltage application time period reaches the preset voltage application time period; and
- the write control circuit writes the set time period into the set time period memory in response to an input control signal.

5. A voltage application time period measuring circuit according to claim 1, wherein the voltage application time period measuring circuit generates the detection signal as a pulse waveform signal.

6. A power supply apparatus, comprising:
- an AC/DC converter for converting an alternating current voltage into a direct current voltage and for outputting an output voltage;
- the voltage application time period measuring circuit according to claim 1, which is inputted the output voltage from the AC/DC converter; and
- an output terminal to which an output voltage from the AC/DC converter is supplied to an outside of the power supply apparatus.

7. A power supply apparatus according to claim 6, wherein when the voltage application time period reaches the preset voltage application time period, the voltage application time period measuring circuit stops an operation of the AC/DC converter.

8. A power supply apparatus according to claim 6, further comprising a cut-off circuit,
- wherein when the voltage application time period reaches the preset voltage application time period, the voltage application time period measuring circuit causes the cut-off circuit to cut off the output voltage supplied to the output terminal.

* * * * *